(12) United States Patent
Ren et al.

(10) Patent No.: US 9,581,854 B2
(45) Date of Patent: Feb. 28, 2017

(54) LIGHT EMITTING DEVICE AND DISPLAY DEVICE USING THE SAME

(71) Applicants: Tsinghua University, Beijing (CN); HON HAI PRECISION INDUSTRY CO., LTD., New Taipei (TW)

(72) Inventors: Meng-Xin Ren, Beijing (CN); Qun-Qing Li, Beijing (CN); Li-Hui Zhang, Beijing (CN); Mo Chen, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 77 days.

(21) Appl. No.: 14/791,245

(22) Filed: Jul. 2, 2015

(65) Prior Publication Data

US 2016/0064612 A1 Mar. 3, 2016

(30) Foreign Application Priority Data

Aug. 26, 2014 (CN) .......................... 2014 1 0426400

(51) Int. Cl.
| | |
|---|---|
| *G02F 1/1335* | (2006.01) |
| *H01L 33/38* | (2010.01) |
| *H01L 33/44* | (2010.01) |
| *H01L 33/40* | (2010.01) |
| *H01L 33/50* | (2010.01) |

(52) U.S. Cl.
CPC .. *G02F 1/133524* (2013.01); *G02F 1/133603* (2013.01); *H01L 33/38* (2013.01); *H01L 33/40* (2013.01); *H01L 33/44* (2013.01); *H01L 33/405* (2013.01); *H01L 33/507* (2013.01); *H01L 33/508* (2013.01); *H01L 2933/0083* (2013.01)

(58) Field of Classification Search
CPC ......... G02F 1/133524; G02F 1/133603; H01L 33/38; H01L 33/40; H01L 33/44
See application file for complete search history.

(56) References Cited

U.S. PATENT DOCUMENTS

| 8,338,819 B2 | 12/2012 | Lu et al. | |
| 2010/0147674 A1* | 6/2010 | Krivoshlykov | G02B 6/122 |
| | | | 204/157.4 |

FOREIGN PATENT DOCUMENTS

| CN | 101572286 | 11/2009 |
| CN | 101752472 | 6/2010 |
| TW | M373504 | 2/2010 |
| TW | 201133937 | 10/2011 |

* cited by examiner

Primary Examiner — David V Bruce
(74) Attorney, Agent, or Firm — Zhigang Ma

(57) ABSTRACT

The disclosure relates to a light emitting device. The light emitting device includes a first electrode, a first semiconductor layer, an active layer, a second semiconductor layer and a second electrode. The first electrode is electrically connected to the first semiconductor layer. The second electrode is electrically connected to the second semiconductor layer. At least one of the first electrode and the second electrode comprises a metal metamaterial layer. The metal metamaterial layer comprises a number of metamaterial units arranged to form a periodic array. A distance between the metal metamaterial layer and the active layer is less than or equal to 100 nanometers. The display device using the light emitting device is also provided.

19 Claims, 20 Drawing Sheets

FIG. 3

LIGHT EMITTING DEVICE AND DISPLAY DEVICE USING THE SAME

CROSS-REFERENCE TO RELATED APPLICATIONS

This application claims all benefits accruing under 35 U.S.C. §119 from China Patent Application No. 201410426400.9, filed on Aug. 26, 2014, in the China Intellectual Property Office, disclosure of which is incorporated herein by reference.

FIELD

The subject matter herein generally relates to light emitting devices and display devices, in particular, to light emitting devices and display devices based on metamaterial.

BACKGROUND

Currently, liquid crystal displays (LCDs) are widely used.

Polarizer is used in the LCD to polarize the inputting light. The polarizer is a usually a film polarizer and will waste half of the incident light intensity. Thus, it not only reduces the brightness of the LCD but also waste the electric energy. Although an additional liquid crystal layer is used to replace the polarizer to polarize the incident light. However, the polarizations of the incident light are all based on far field operation.

What is needed, therefore, is to provide a light emitting device and a display device for solving the problem discussed above.

BRIEF DESCRIPTION OF THE DRAWINGS

Implementations of the present technology will now be described, by way of example only, with reference to the attached figures, wherein:

FIG. 3 shows a plurality of metamaterial units in different shapes.

DETAILED DESCRIPTION

Figure 1:
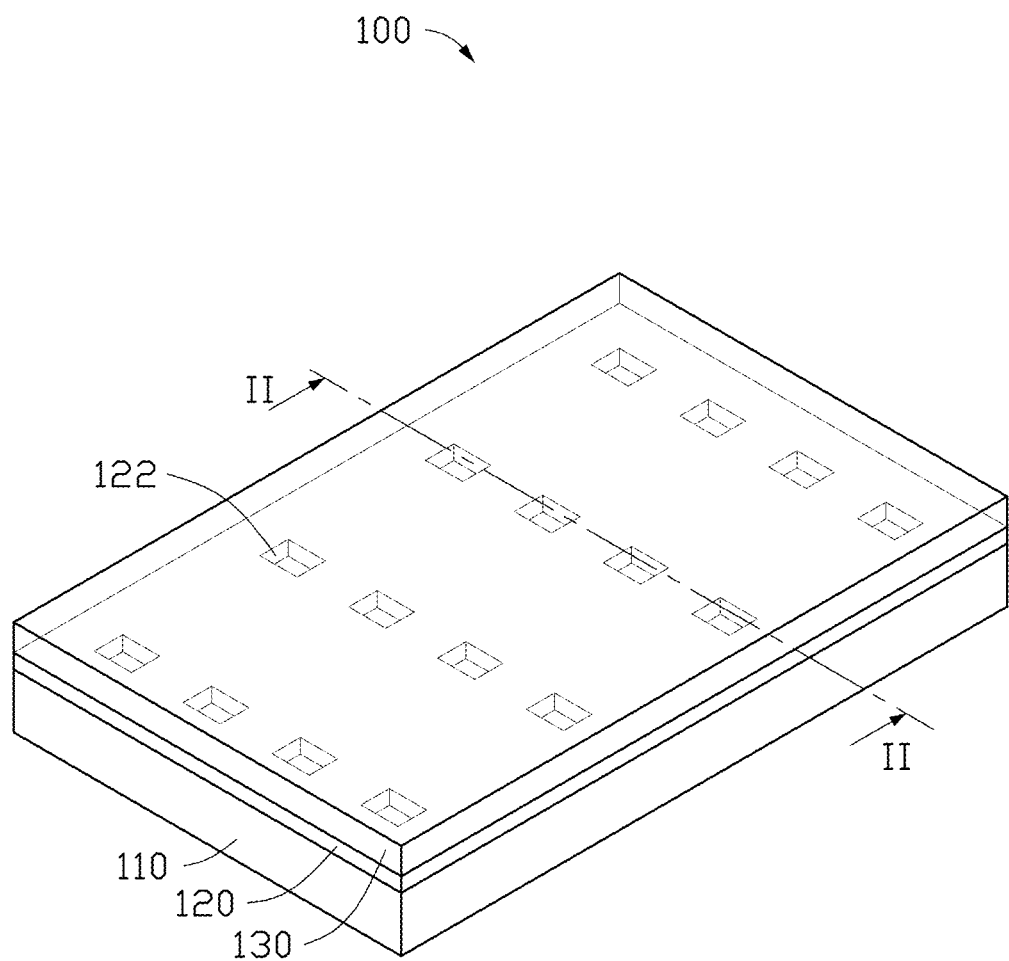
FIG. 1 is a schematic view of one embodiment of a light emitting device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present light emitting devices and display devices based on metamaterial.

Figure 2:
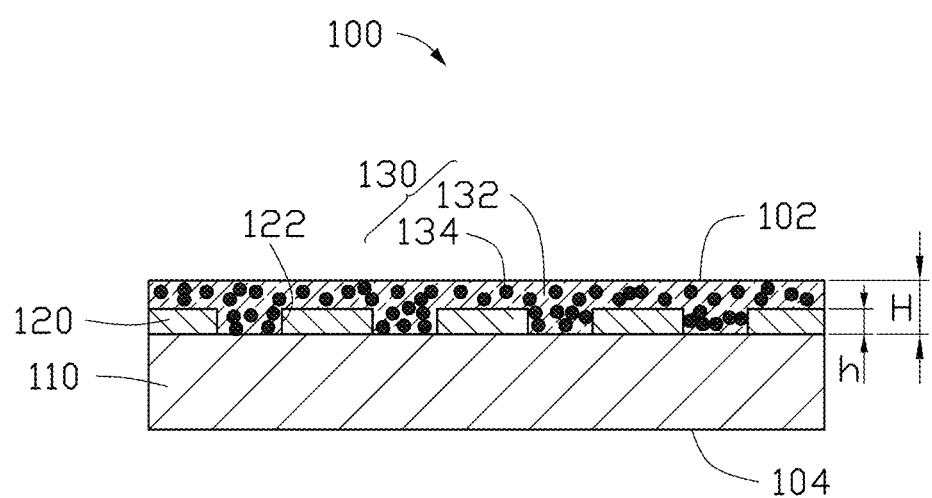
FIG. 2 is a cross-sectional view along line II-II of FIG. 1.

Referring to FIGS. 1-2, a light emitting device 100 of one embodiment includes an insulative transparent substrate 110, a metamaterial layer 120 and a light emitting layer 130. The insulative transparent substrate 110, the metamaterial layer 120 and the light emitting layer 130 are stacked with each other.

The metamaterial layer 120 is located on a surface of the insulative transparent substrate 110. The light emitting layer 130 is located on a surface of the metamaterial layer 120 so that the metamaterial layer 120 is sandwiched between the insulative transparent substrate 110 and the light emitting layer 130. The light emitting layer 130 covers the metamaterial layer 120. Furthermore, an optional transparent protective layer (not shown) can be located on a surface of the light emitting layer 130 that is spaced from the metamaterial layer 120.

The insulative transparent substrate 110 can be flat or curved and configured to support other elements. The insulative transparent substrate 110 can be made of rigid materials such as silicon oxide, silicon nitride, ceramic, glass, quartz, diamond, plastic or any other suitable material. The insulative transparent substrate 110 can also be made of flexible materials such as polycarbonate (PC), polymethyl methacrylate acrylic (PMMA), polyimide (PI), polyethylene terephthalate (PET), polyethylene (PE), polyether polysulfones (PES), polyvinyl polychloride (PVC), benzocyclobutenes (BCB), polyesters, or acrylic resin. The size and shape of the insulative transparent substrate 110 can be selected according to need. For example, the thickness of the insulative transparent substrate 110 is in a range from about 100 micrometers to about 500 micrometers. In one embodiment, the insulative transparent substrate 110 is a silicon dioxide layer with a thickness of 200 micrometers. If the metamaterial layer 120 and the light emitting layer 130 is free standing, the insulative transparent substrate 110 is optional.

Figure 3:
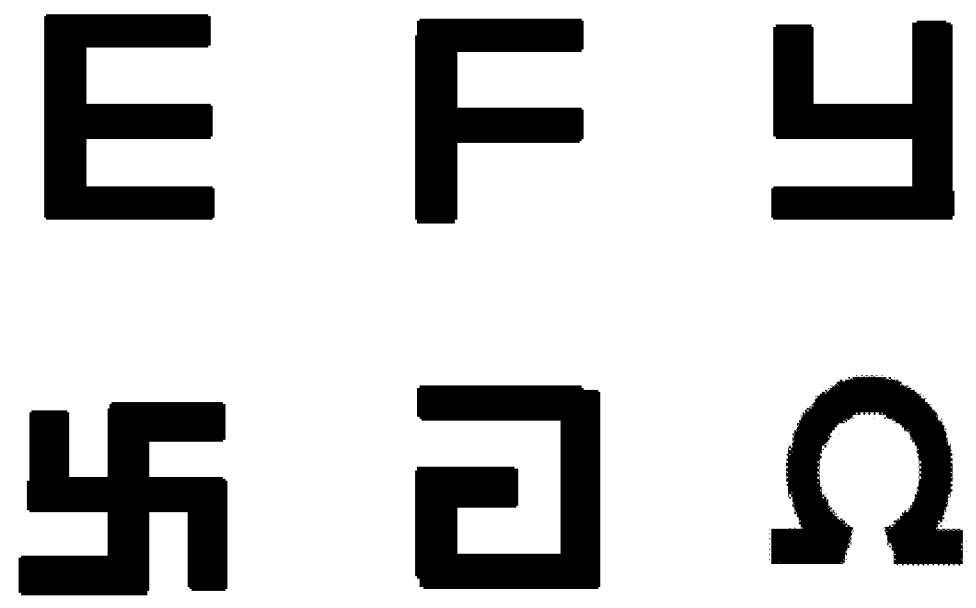

The metamaterial layer 120 includes metamaterial which is artificial material engineered to have properties that have not yet been found in nature, such as negative refractive index. The metamaterial layer 120 includes a plurality of metamaterial units 122 arranged to form a periodic array. The plurality of metamaterial units 122 can be a plurality of bulges protruded from a surface of the insulative transparent substrate 110 or a plurality of apertures/holes defined by and extending through the insulative transparent substrate 110. The plurality of bulges are spaced from each other so that the metamaterial layer 120 allows light to pass through. The shapes of the plurality of metamaterial units 122 can be the patterns as shown in FIG. 3, or mirror image of the patterns of FIG. 3, or the patterns of FIG. 3 being rotated. The patterns of the metamaterial units 122 of FIG. 3 can be E, F, 님, ℥, ᴈ, and Ω.

Figure 4:
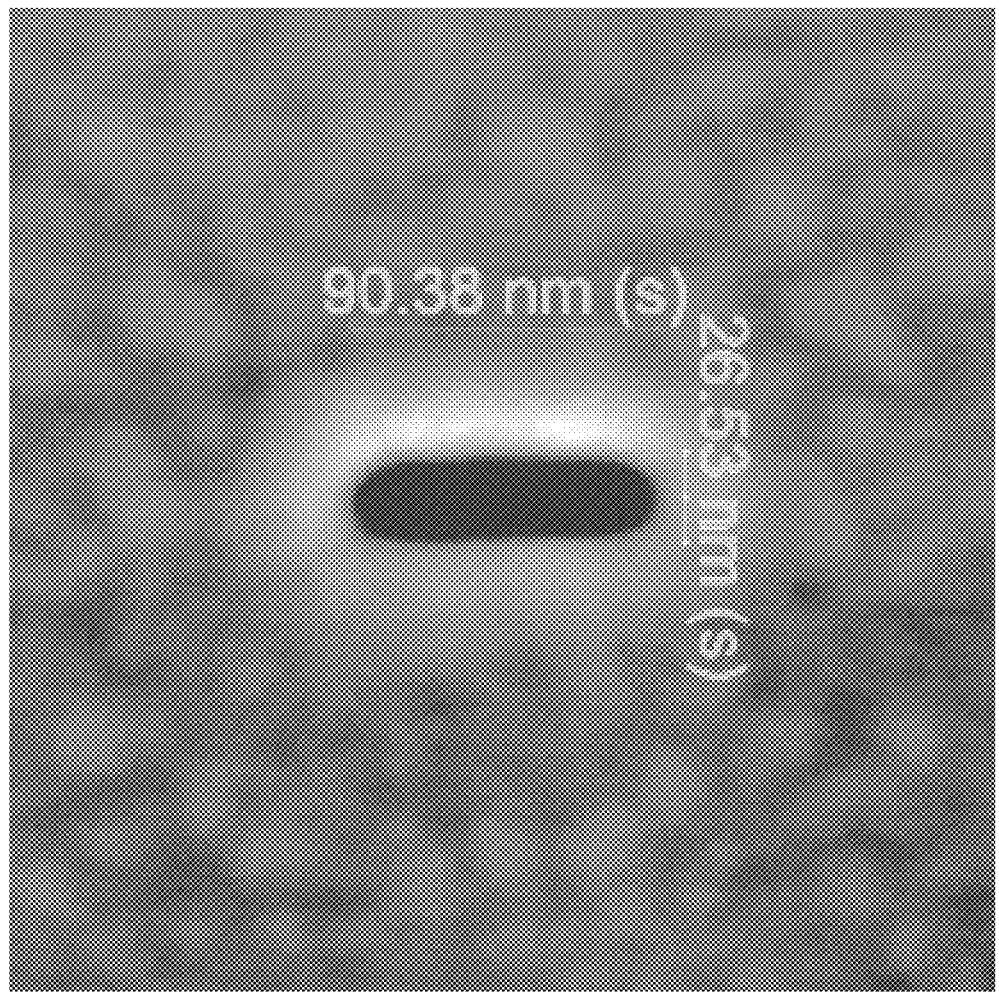
FIG. 4 is a Scanning Electron Microscope (SEM) image of one embodiment of a metamaterial unit.

The thickness h of the metamaterial units 122 can be in a range from about 30 nanometers to about 100 nanometers, the period of the metamaterial units 122 can be in a range from about 300 nanometers to about 500 nanometers, and the line width of the metamaterial unit 122 can be in a range from about 30 nanometers to about 40 nanometers. The size of the metamaterial unit 122 can be less than or equal to wavelength of the light emitted from the light emitting layer 130. In one embodiment, the size of the metamaterial unit 122 in each direction is less than 100 nanometers. The material of the metamaterial layer 120 is metal which can generate surface plasmons (SPS). The metal can be gold, silver, copper, iron, aluminum, nickel or alloys thereof. The metamaterial layer 120 can be fabricated by treating a metal layer by focusing ion beam etching or electron beam lithography. In one embodiment, the metamaterial layer 120 is made by depositing a gold film on the surface of the silicon dioxide layer and focusing ion beam etching the gold film to obtain a plurality of strip-shaped apertures arranged to form a periodic array. The plurality of strip-shaped aperture are used as the metamaterial units 122. The thickness of the gold film is 50 nanometers. The period of the strip-shaped apertures is 250 nanometers. As shown in FIG. 4, the length of the strip-shaped aperture is 90.38 nanometers. The width of the strip-shaped aperture is 26.53 nanometers. As shown in Table 1 below, the metamaterial unit 122 can be classified into four categories according to the properties of chirality symmetry, isotropy and polarized light. The metamaterial units 122 of strip-shaped apertures are belong to category 4 of the Table 1

TABLE 1

| Categories | Chirality Symmetry | Isotropy | Classification of polarized light |
|---|---|---|---|
| 1 | Yes | Yes | Circularly polarized light |
| 2 | Yes | No | Elliptically polarized light |
| 3 | No | Yes | Non-polarized light |
| 4 | No | No | Linearly polarized light |

The light emitting layer 130 includes photoluminescent material, such as semiconductor quantum dots, dye molecules or fluorescent powder. The semiconductor quantum dots can be PbS quantum dots, CdSe quantum dots or GaAs quantum dots. The diameter of the semiconductor quantum dot can be in a range from about 10 nanometers to about 200 nanometers. The dye molecules can be rhodamine 6G. The light emitting layer 130 is located on a surface of the metamaterial layer 120 and extends through the metamaterial layer 120 to be in direct contact with the insulative transparent substrate 110. The surface of the light emitting layer 130 that is spaced from the metamaterial layer 120 can be flat or curved. The thickness H of the light emitting layer 130 can be in a range from about 50 nanometers to about 500 nanometers, such as from about 100 nanometers to about 200 nanometers. The light emitting layer 130 can be fabricated by spinning coating, spraying, printing, or depositing. In one embodiment, the light emitting layer 130 includes a polymer matrix 132 and a plurality of CdSe quantum dots 134 dispersed in the polymer matrix 132. The thickness of the light emitting layer 130 is 100 nanometers. The light emitting layer 130 is made by dispersing the CdSe quantum dots 134 in photoresist to form a mixture solution, and then spinning coating the mixture solution on the metamaterial layer 120.

Figure 5:
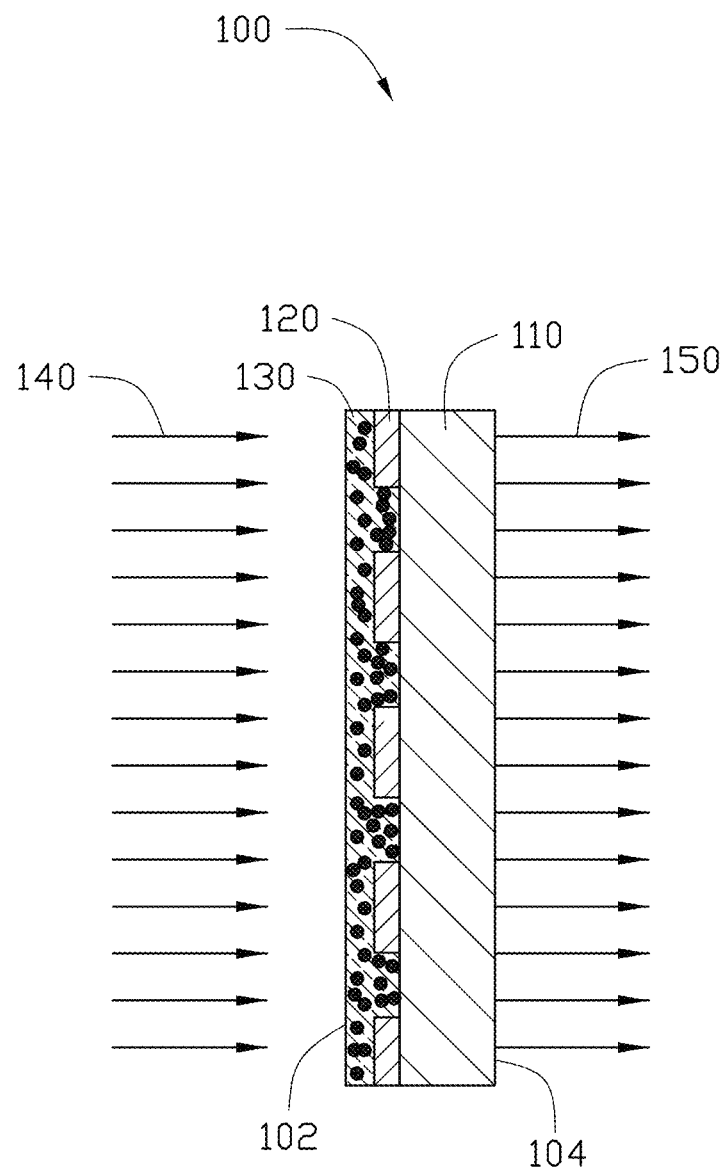
FIG. 5 shows how the light emitting device of FIG. 1 works by irradiating from the front surface and outputting light from the back surface.
Figure 6:
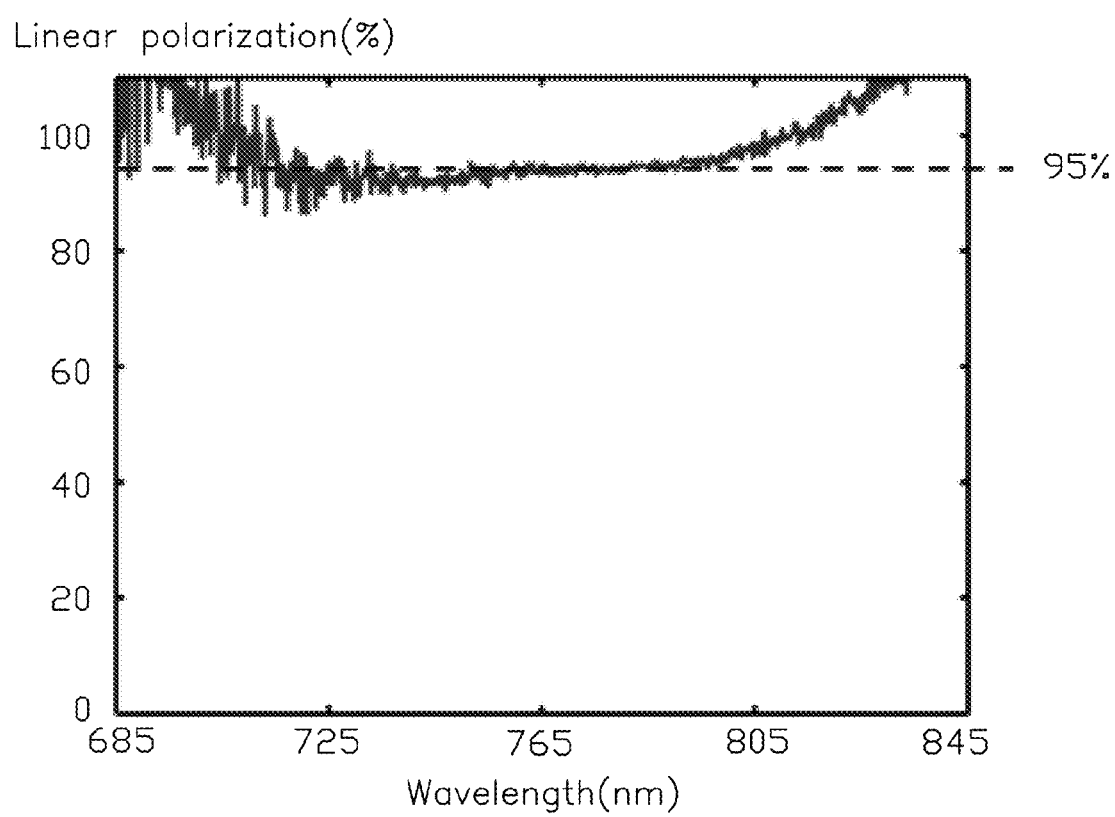
FIG. 6 is a polarization testing result of the light emitting device of FIG. 1 on the work mode of FIG. 5.
Figure 7:
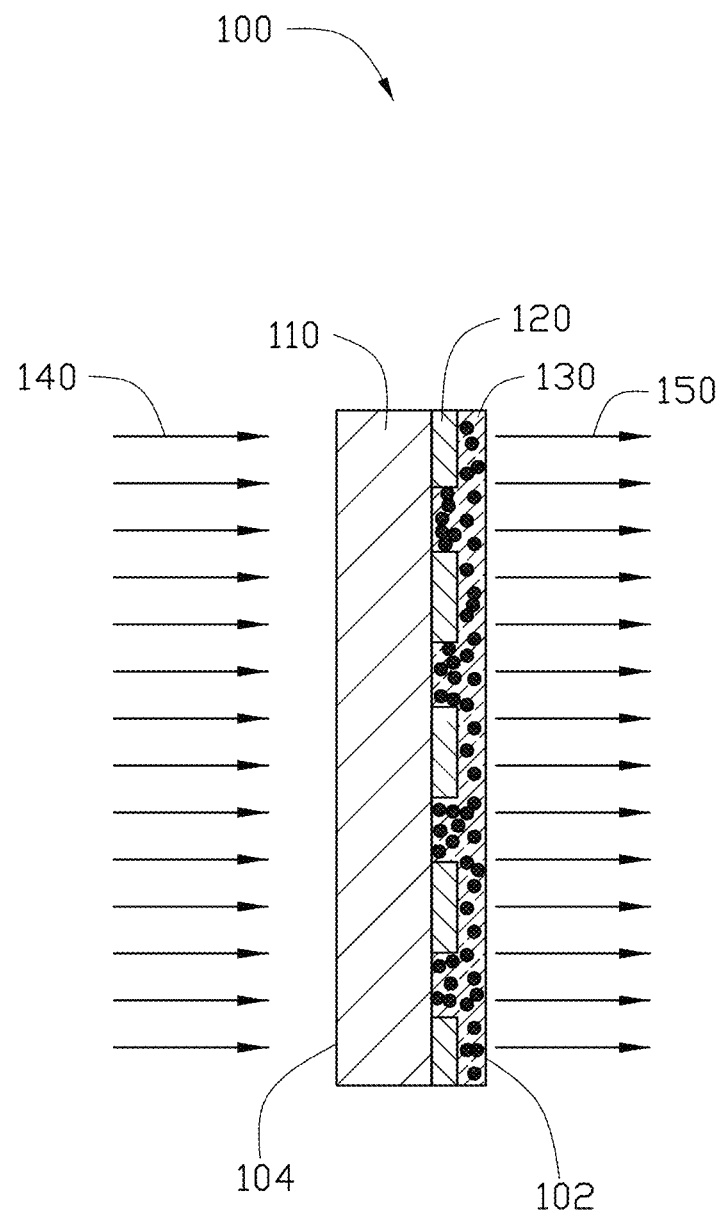
FIG. 7 shows how the light emitting device of FIG. 1 works by irradiating from the back surface and outputting light from the front surface.
Figure 8:
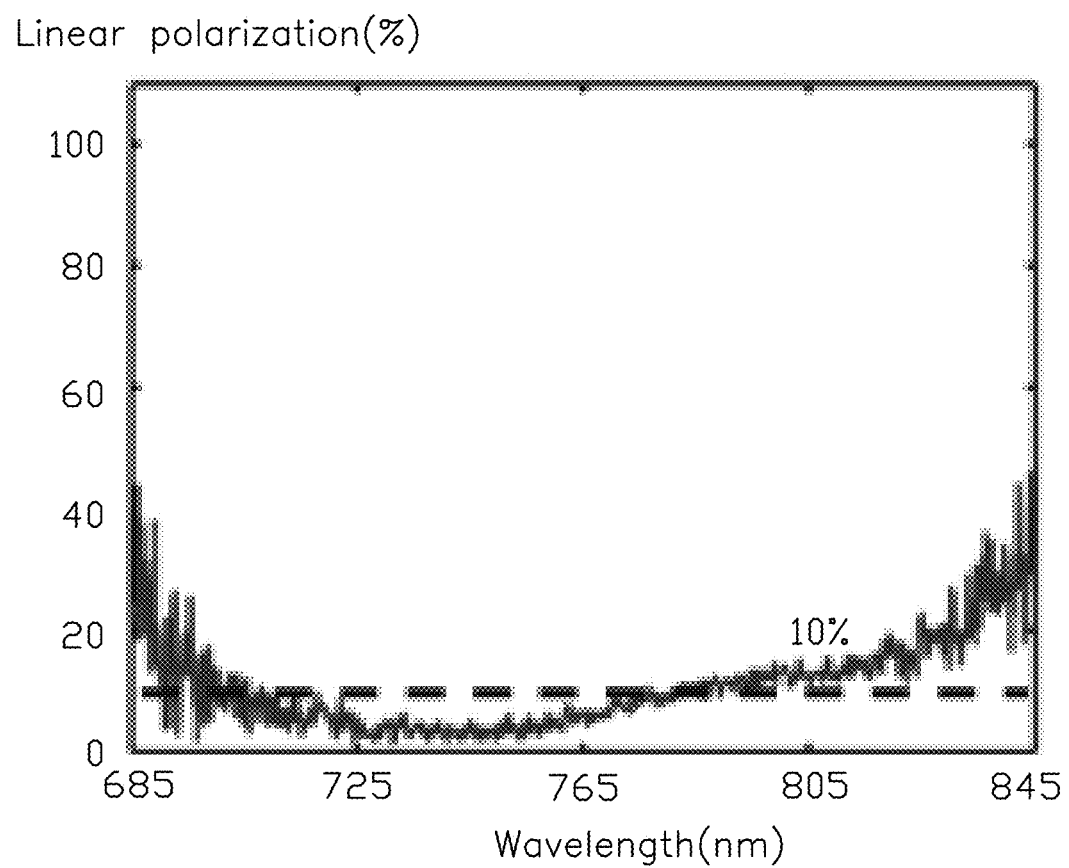
FIG. 8 is a polarization testing result of the light emitting device of FIG. 1 on the work mode of FIG. 7.

The surface of the light emitting layer 130 that is spaced from the insulative transparent substrate 110 is defined as a front surface 102. The surface of the insulative transparent substrate 110 that is spaced from the light emitting layer 130 is defined as back surface 104. As shown in FIG. 5, when the incident light 140 irradiate the light emitting device 100 from the front surface 102, light emitted from the light emitting layer 130 will pass through the metamaterial layer 120 to output from the back surface 104 to form the emitted light 150. Usually, the incident light 140 is laser light. As shown in FIG. 6, the degree of linear polarization of the emitted light 150 from the back surface 104 is 95%. As shown in FIG. 7, when the incident light 140 irradiate the light emitting device 100 from the back surface 104, light emitted from the light emitting layer 130 will output from the front surface 102 directly to form the emitted light 150. As shown in FIG. 8, the linear polarization of the emitted light 150 from the front surface 102 is 10%. The linear polarization of the emitted light 150 of FIG. 5 is much greater than the linear polarization of the emitted light 150 of FIG. 7. When the emitted light 150 pass through the metamaterial layer 120, the linear polarization of the emitted light 150 is enhanced.

Usually, a light source with a distance far than a wavelength can be seen as a far field light source, and a light source with a distance close to 1/10 wavelength can be seen as a near field light source. The wavelength of visible light is in a range from about 390 nanometers to about 770 nanometers. Usually, the electromagnetic field is localized in the subwavelength scale near the surface of the metamaterials. Therefore, the light emitting layer 130 of visible light with a thickness less than 100 nanometers is within the near field domain of the metamaterial layer 120, which guarantees the strong interaction between the metamaterial layer 120 and the light emitting layer 130.

The metamaterial layer 120 can be regarded as a nano antenna array for the electromagnetic waves and will cause scattering to the electromagnetic waves nearby. According to the classical electromagnetic theory the electromagnetic waves that were previously emitted by the dipole sources undergo a series of scattering events on the antenna elements, which would rebound back and, in turn, work as the driving field for the dipole moments. Secondary emission would be induced, which influences the total emission fields through superimposing on the previously emitted fields. Notably, the secondary emitted field is polarized identically to the scattering driving fields. In one embodiment, the metamaterial layer 120 of FIG. 1 show different scattering strengths for orthogonally polarizations, the scattering along Y-direction could be enhanced, whereas the scattering fields along the X-direction is overwhelmed. As a result, the linearly Y-polarized emission in the far-field happens. According to the Fresnel rule and the boundary conditions of electromagnetic fields, the emitted light 150 on the back surface 104 has higher polarization.

Figure 9:
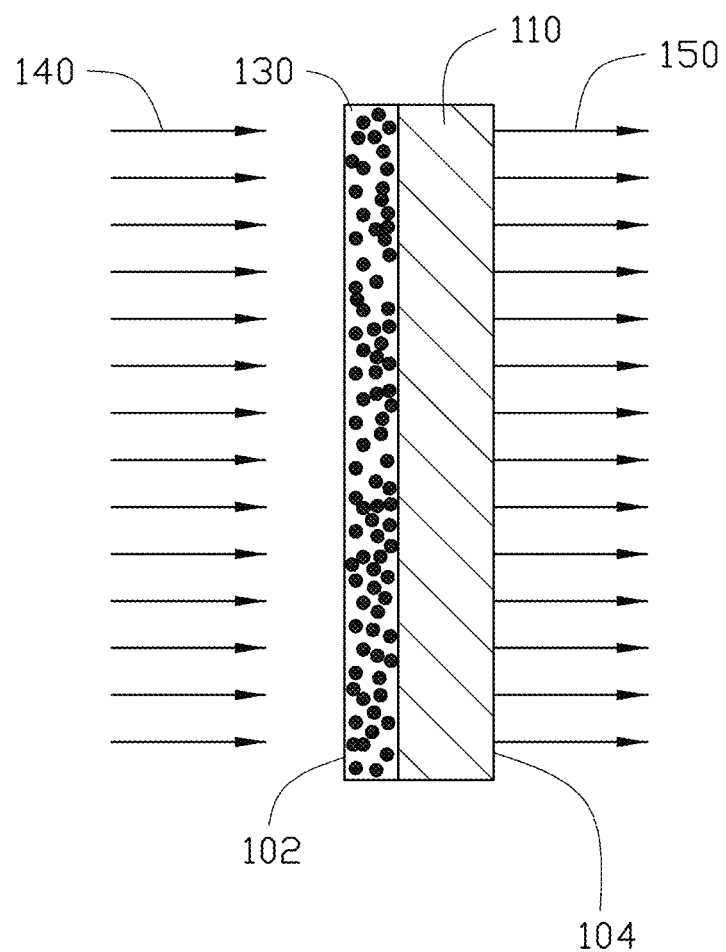
FIG. 9 shows how a light emitting device of a compare embodiment works.
Figure 10:
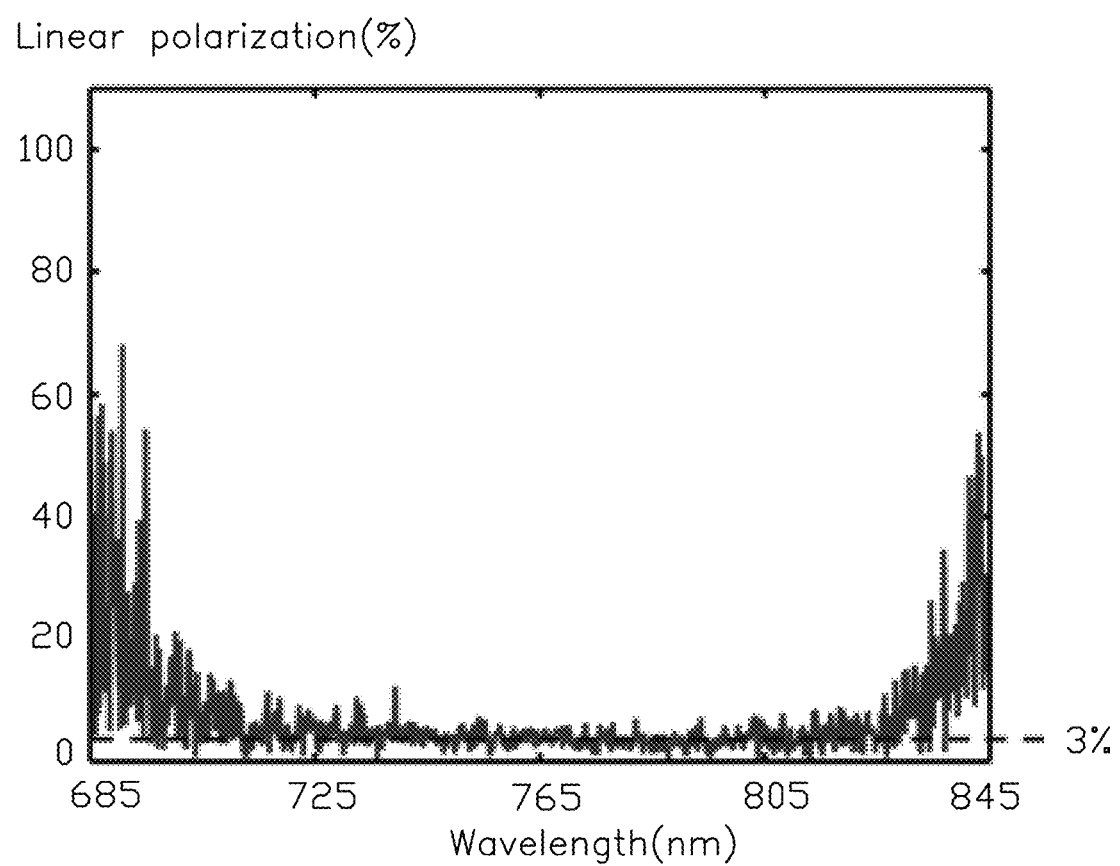
FIG. 10 is a polarization testing result of the light emitting device of FIG. 9.

Furthermore, as shown in FIGS. 9-10, in one compare embodiment, the light emitting layer 130 is directly located on a surface of the insulative transparent substrate 110 without any metamaterial layer therebetween. When the incident light 140 irradiate the light emitting layer 130 from the front surface 102, the emitted light 150 from the back surface 104 is non-linearly polarized light. Thus, the polarization property of the light emitting device 100 is caused by the metamaterial layer 120.

Figure 11:
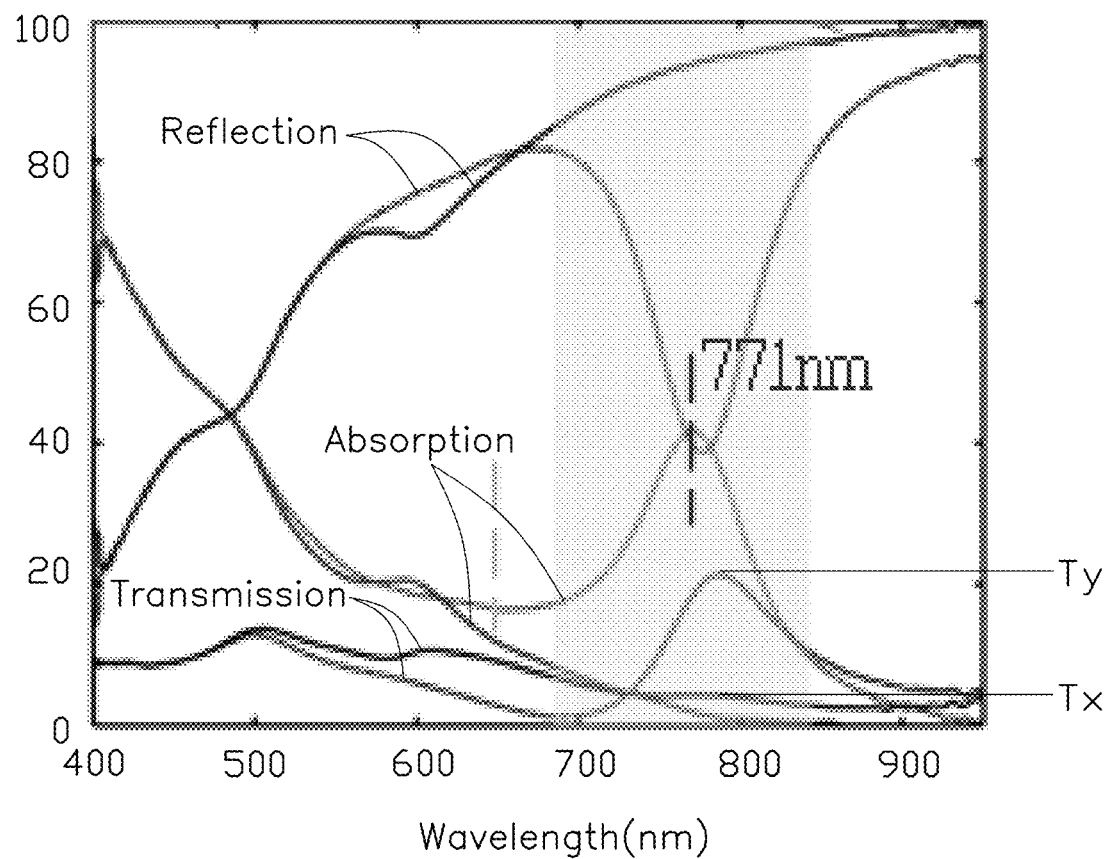
FIG. 11 shows testing results of transmission, reflection and absorption of a metamaterial layer in a far field of another compare embodiment.

In another compare embodiment, the transmission, reflection and absorption of the metamaterial layer 120 are tested when a far field plane wave light source is used to irradiate the light emitting device 100. The far field plane wave light source emits white light, which would not activate the light emitting layer 130 to emit light, to irradiate the light emitting device 100 from front side 102. As shown in FIG. 11, Ty/Tx is about 5, where the Ty represents the transmission of the Y polarized light of the emitted light 150 and Tx represents the transmission of the X polarized light of the emitted light 150. The linear polarization of the transmission light can be calculated by $(I_{max}-I_{min})/(I_{max}+I_{min})=(5-1)/(5+1)\sim67\%$. Therefore, the polarization of the metamaterial layer 120 for far field light source is about 67%, but for near field light source is about 95%. Therefore, the polarization of the emitted light 150 of the light emitting device 100 is not caused simply by the transmission of the metamaterial layer 120, but caused by that the metamaterial layer 120 adjust the radiation rate of the light emitting layer 130 which is a near field light source.

The light emitting device 100 has following advantages. First, the brightness of the emitted light 150 can be enhanced because the plasmon resonance of the metamaterial layer 120. Second, the light emitted from the light emitting layer 130 are polarized in nano-scale by the polarization of plasmon resonance of the metamaterial layer 120 so that the light emitting device 100 can emit polarized light directly.

Figure 12:
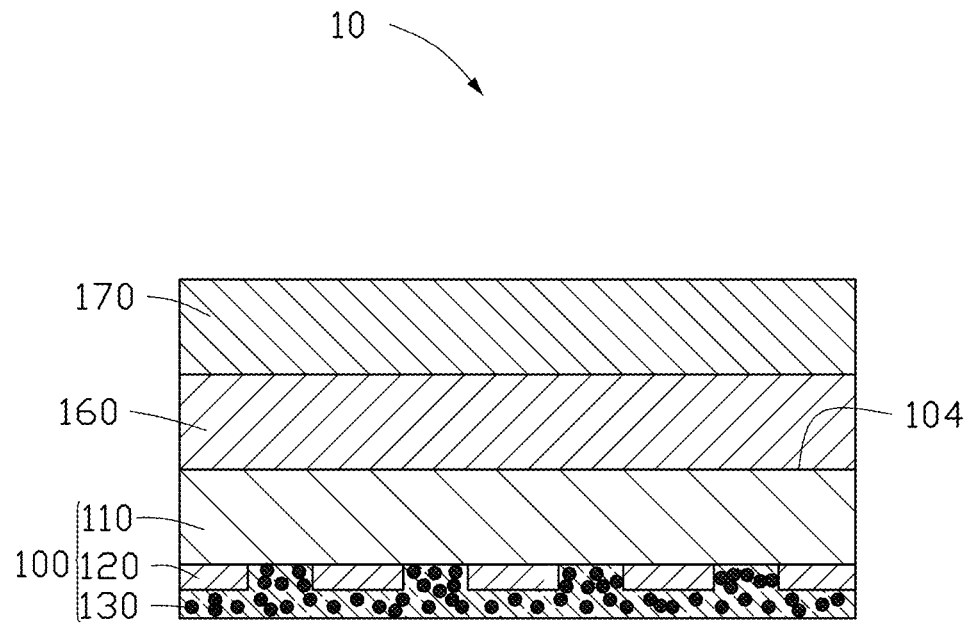
FIG. 12 is a schematic view of one embodiment of a display device.

Referring to FIG. 12, a display device 10 is provided. The display device 10 includes the light emitting device 100, a light guide plate 160 and a liquid crystal panel 170. The light emitting device 100, the light guide plate 160 and the liquid crystal panel 170 are stacked with each other in that order. The light guide plate 160 is located on the back surface 104 of the insulative transparent substrate 110 and sandwiched between the light emitting device 100 and the liquid crystal panel 170. The light emitting device 100 is used as a light source of the display device 10. Because the light emitting device 100 can emit polarized light directly, the display device 10 is simple and does not need other polarizer. The display device 10 can also include the light emitting devices 200, 300, 400 of embodiments below.

Figure 13:
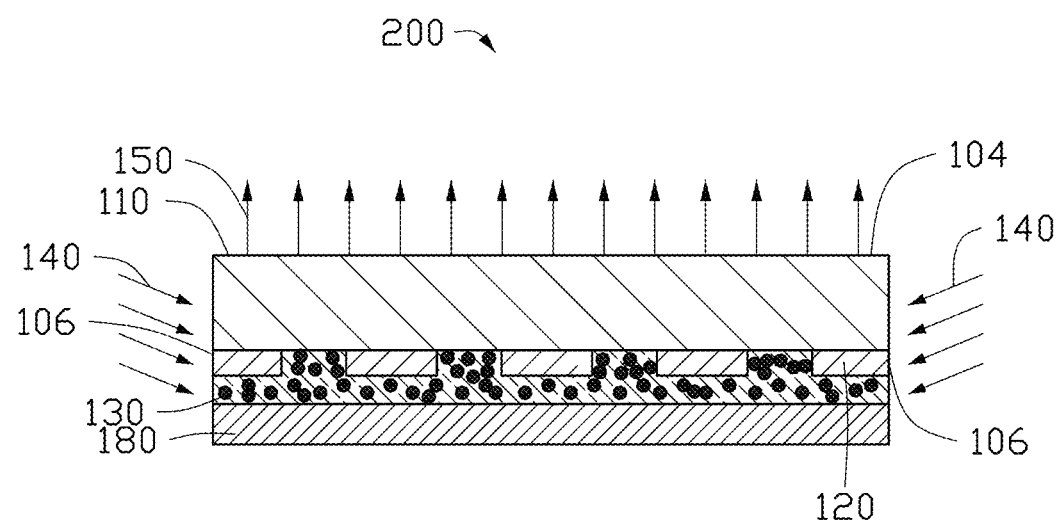
FIG. 13 is a schematic view of another one embodiment of a light emitting device.

Referring to FIG. 13, a light emitting device 200 of one embodiment includes the insulative transparent substrate 110, the metamaterial layer 120, the light emitting layer 130 and a reflection layer 180. The insulative transparent substrate 110, the metamaterial layer 120, the light emitting layer 130 and the reflection layer 180 are stacked with each other.

The light emitting device 200 is similar with the light emitting device 100 except that the reflection layer 180 is located on and covers the light emitting layer 130 so that the light emitting layer 130 is sandwiched between the insulative transparent substrate 110 and the reflection layer 180. The reflection layer 180 can be a metal film such as a gold film. Because part of the light that is emitted from the light emitting layer 130 and travel to the reflection layer 180 will be reflected by the reflection layer 180 to pass through the metamaterial layer 120 to output from the back surface 104, the light emitting efficiency of the light emitting device 200 is enhanced.

In work of the light emitting device 200, the incident light 140 can irradiate the light emitting device 200 from the back surface 104 or side surface 106. The emitted light 150 output from the back surface 104. In one embodiment, the incident light 140 irradiate the light emitting device 200 from entire side surface 106 so that more emitted light 150 can output from the back surface 104.

Figure 14:
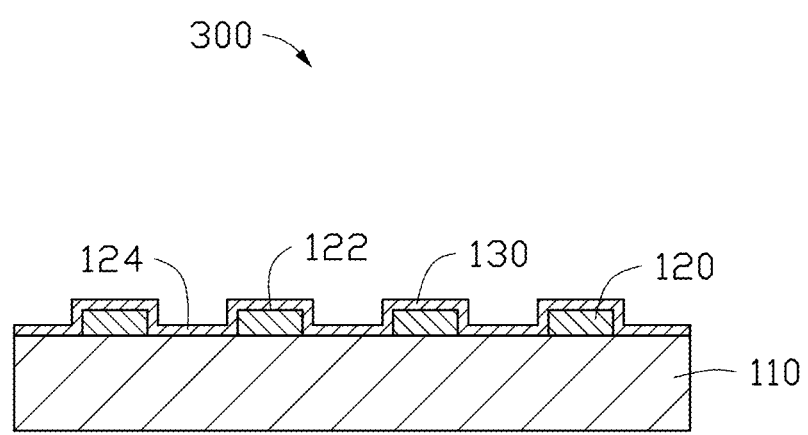
FIG. 14 is a schematic view of another one embodiment of a light emitting device.

Referring to FIG. 14, a light emitting device 300 of one embodiment includes the insulative transparent substrate 110, the metamaterial layer 120, and the light emitting layer 130. The insulative transparent substrate 110, the metamaterial layer 120, and the light emitting layer 130 are stacked with each other.

Figure 15:
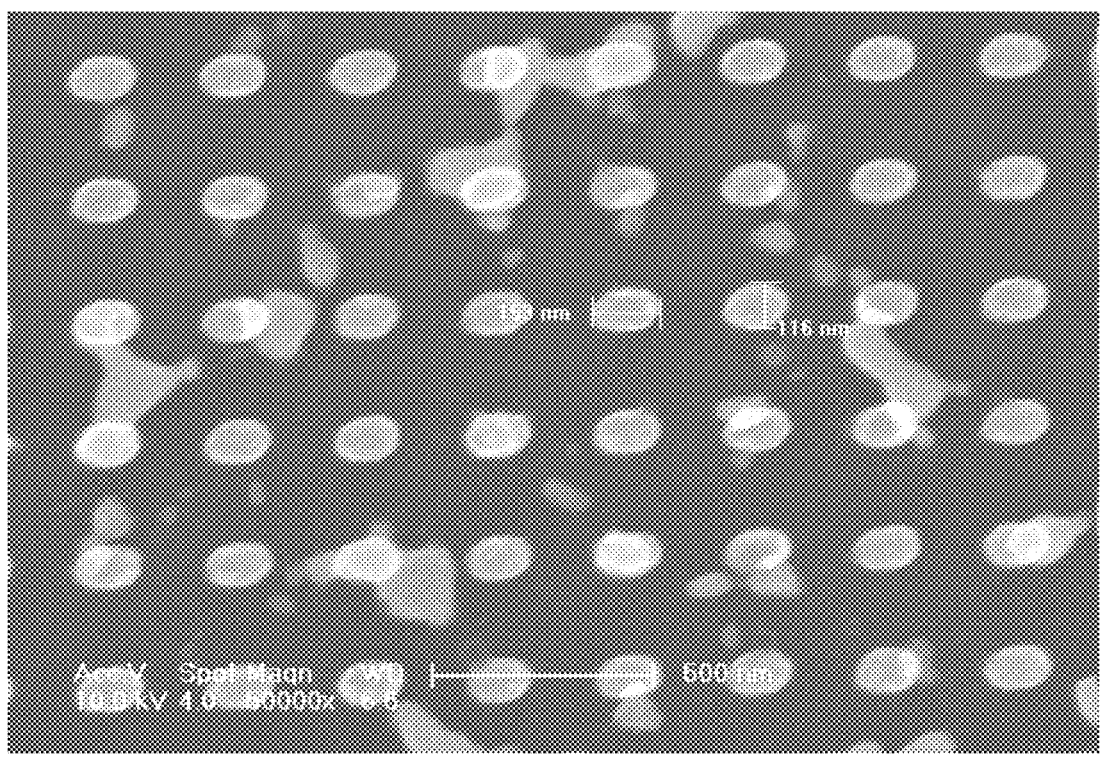
FIG. 15 is an SEM image of one embodiment of a metamaterial unit.

The light emitting device 300 is similar with the light emitting device 100 except that the metamaterial layer 120 includes a plurality of strip-shaped bulges arranged to form a periodic array and used as a plurality of metamaterial units 122. The metamaterial layer 120 defined a plurality of spaces 124 between adjacent metamaterial units 122. The light emitting layer 130 is wave-shaped and has a uniform thickness. The light emitting layer 130 has a plurality of first surfaces and a plurality of second surface depressed from the plurality of first surfaces. As shown in FIG. 15, the plurality of metamaterial units 122 are arranged to form a two dimensional array. In one embodiment, the thickness of the strip-shaped bulges is 50 nanometers, the period of the strip-shaped bulges is 300 nanometers, the length of the strip-shaped bulge is 152 nanometers, and the width of the strip-shaped bulge is 116 nanometers.

Figure 16:
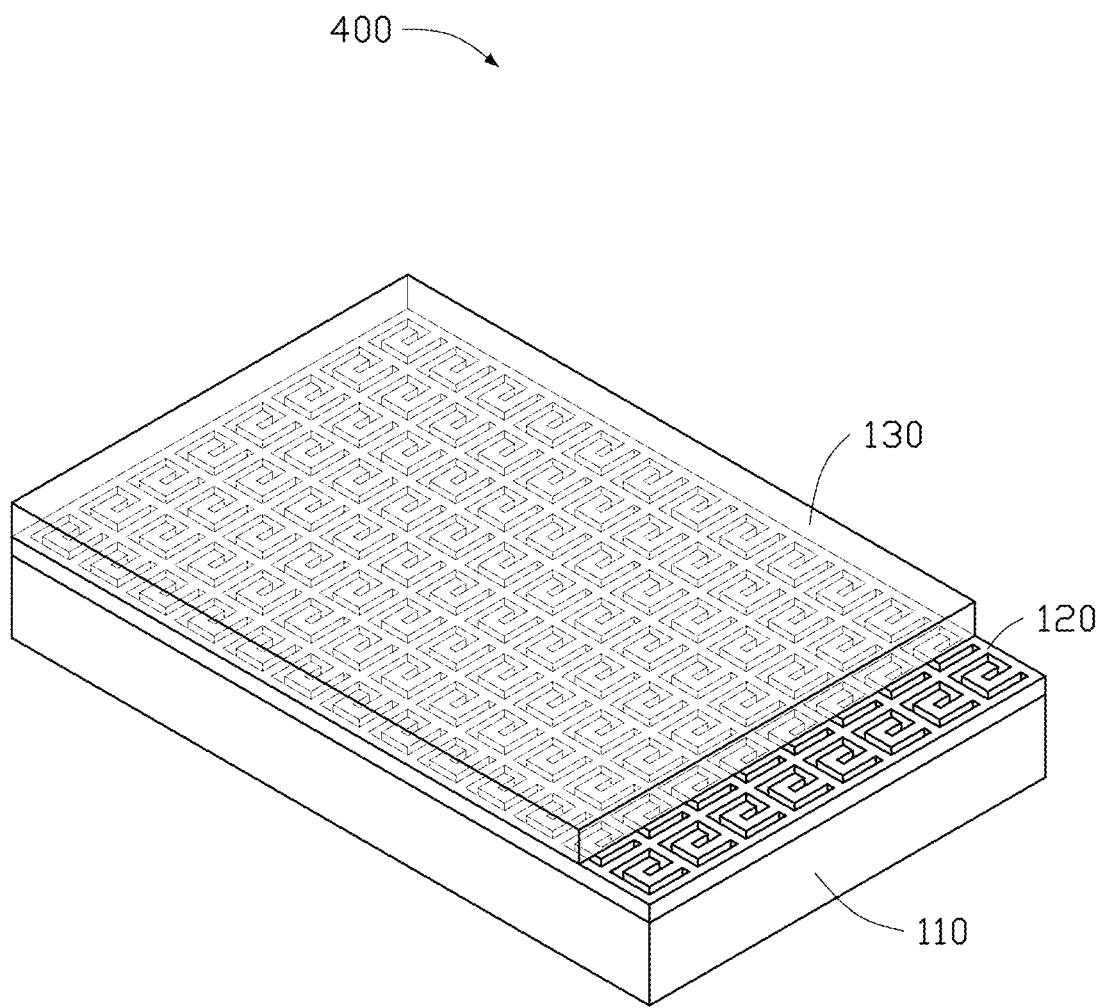
FIG. 16 is a schematic view of another one embodiment of a light emitting device.

Referring to FIG. 16, a light emitting device 400 of one embodiment includes the insulative transparent substrate 110, the metamaterial layer 120, and the light emitting layer 130. The insulative transparent substrate 110, the metamaterial layer 120, and the light emitting layer 130 are stacked with each other.

The light emitting device 400 is similar with the light emitting device 100 except that the plurality of metamaterial units 122 are a plurality of a shaped apertures arranged to form a periodic two dimensional array. The plurality of a shaped apertures is fabricated by etching a gold film. In one embodiment, the thickness of the gold film is 50 nanometers, the period of the a shaped apertures is 400 nanometers, and the line width of the a shaped aperture is 40 nanometers.

The light emitting devices 100, 200, 300, 400 are all optical pumping light emitting devices and work by light irradiating. The light emitting devices 500, 600, 700, 800 below are electric pumping light emitting devices and work by supplying a voltage or current.

Figure 17:
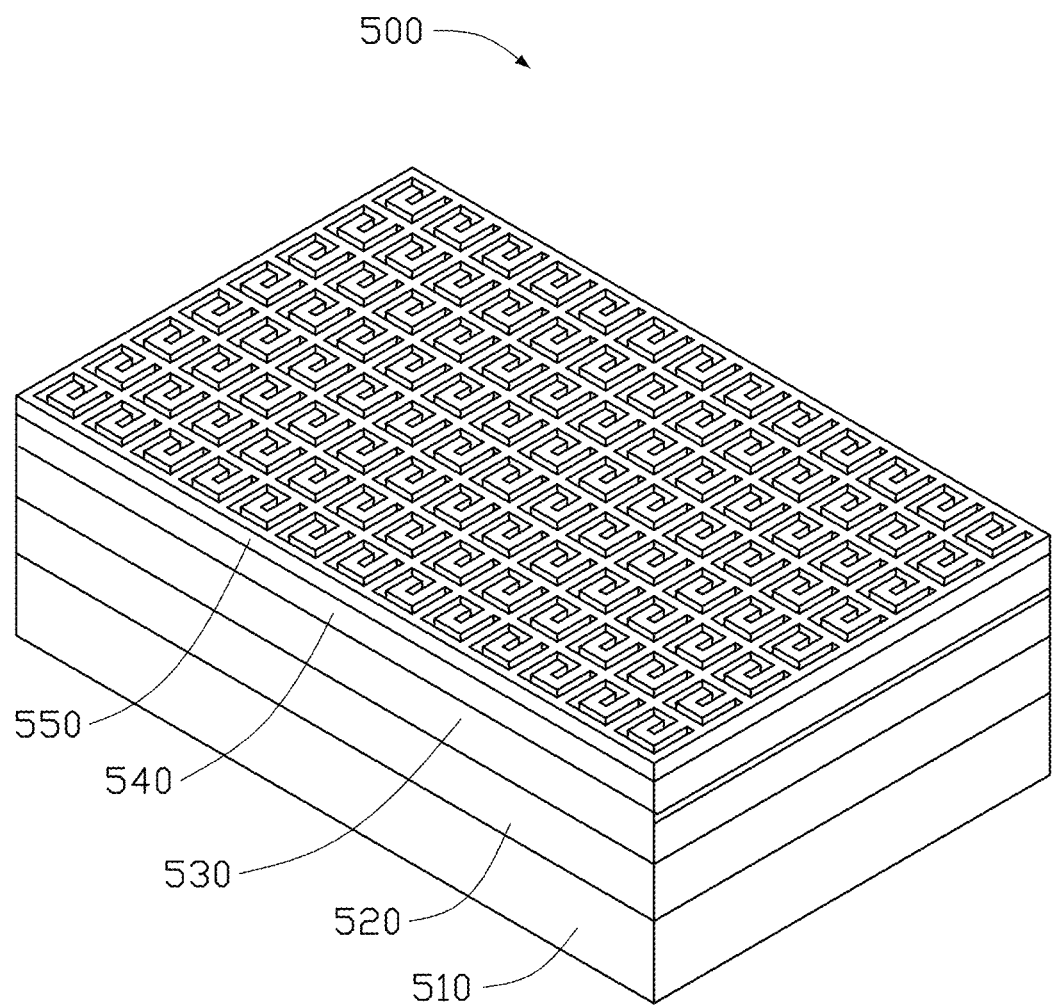
FIG. 17 is a schematic view of another one embodiment of a light emitting device.

Referring to FIG. 17, a light emitting device 500 of one embodiment is a vertical structure light emitting diode (LED) and includes a first electrode 510, a first semiconductor layer 520, an active layer 530, a second semiconductor layer 540 and a second electrode 550.

The first electrode 510, the first semiconductor layer 520, the active layer 530, the second semiconductor layer 540 and the second electrode 550 are stacked with each other in that order. The first electrode 510 is electrically connected to the first semiconductor layer 520. The second electrode 550 is electrically connected to the second semiconductor layer 540. At least one of the first electrode 510 and the second electrode 550 is a metal metamaterial layer, and the distance between the metal metamaterial layer and the active layer 530 is less than or equal to 100 nanometers. In one embodiment, the distance between the metal metamaterial layer and the active layer 530 is less than or equal to 50 nanometers. The active layer 530 can be seen as a near field light source of the metal metamaterial layer.

If the first semiconductor layer 520 is an N-type semiconductor, the second semiconductor layer 540 is a P-type semiconductor, and vice versa. The N-type semiconductor layer provides negative electrons, and the P-type semiconductor layer provides positive holes. The N-type semiconductor layer can be made of N-type gallium nitride, N-type gallium arsenide, or N-type copper phosphate. The P-type semiconductor layer can be made of P-type gallium nitride, P-type gallium arsenide, or P-type copper phosphate. The first semiconductor layer 520 can have a thickness of about 50 nanometers to about 3 micrometers. The second semiconductor layer 540 can have a thickness of about 50 nanometers to about 3 micrometers. If the first electrode 510 is a metal metamaterial layer, the thickness of the first semiconductor layer 520 should be less than 50 nanometers so that the distance between the first electrode 510 and the active layer 530 is less than 50 nanometers. If the second electrode 550 is a metal metamaterial layer, the thickness of the second semiconductor layer 540 should be less than 50 nanometers so that the distance between the second electrode 550 and the active layer 530 is less than 50 nanometers.

The active layer 530 is sandwiched between the first semiconductor layer 520 and the second semiconductor layer 540. The active layer 530 is a photon exciting layer and can be one of a single quantum well layer or multilayer quantum well films. The active layer 530 can be made of gallium indium nitride (GaInN), aluminum indium gallium nitride (AlGaInN), gallium arsenide (GaSn), aluminum gallium arsenide (AlGaSn), gallium indium phosphide (GaInP), or aluminum gallium arsenide (GaInSn). The active layer 530, in which the electrons fill the holes, can have a thickness of about 0.01 micrometers to about 0.6 micrometers.

The first electrode 510 may be a P-type or an N-type electrode and is the same type as the first semiconductor layer 520. The second electrode 550 may be a P-type or an N-type electrode and is the same type as the second semiconductor layer 540. The thickness of the first electrode 510 can range from about 0.01 micrometers to about 2 micrometers. The thickness of the second electrode 550 can range from about 0.01 micrometers to about 2 micrometers. The material of the first electrode 510 and the second electrode 550 is metal such as gold, silver, copper, iron, aluminum, nickel, titanium, or alloys thereof.

In one embodiment, the first semiconductor layer 520 is an N-type gallium nitride layer with a thickness of 0.3 micrometers, and the second semiconductor layer 540 is a P-type gallium nitride layer with a thickness of 100 nanometers, and the active layer 530 includes a GaInN layer and a GaN layer stacked with each other and has a thickness of about 0.03 micrometers. The first electrode 510 is N-type electrode and includes a nickel layer and a gold layer. The thickness of the nickel layer is about 15 nanometers. The thickness of the gold layer is about 200 nanometers. The second electrode 550 is P-type electrode and includes a metal metamaterial layer having the same pattern as the metamaterial layer 120 of FIG. 16 and a thickness of 100 nanometers.

In work, a voltage is supplied to the light emitting device 500 through the first electrode 510 and the second electrode 550. The active layer 530 is activated to produce photons. The photons output from the second electrode 550. Because the second electrode 550 is a metal metamaterial layer spaced from the active layer 530 with a distance less than 100 nanometers, the light emitting rate of the active layer 530 can be enhanced by the plasmons of the metal metamaterial layer. Furthermore, the light emitting device 500 can emit polarized light directly because of the polarization of the metal metamaterial layer.

In anther embodiment, both the first electrode 510 and the second electrode 550 is metal metamaterial layer, and both the first semiconductor layer 520 and the second semiconductor layer 540 has thickness less than 100 nanometers. The photons produced from the active layer 530 can output from both the first electrode 510 and the second electrode 550.

Figure 18:
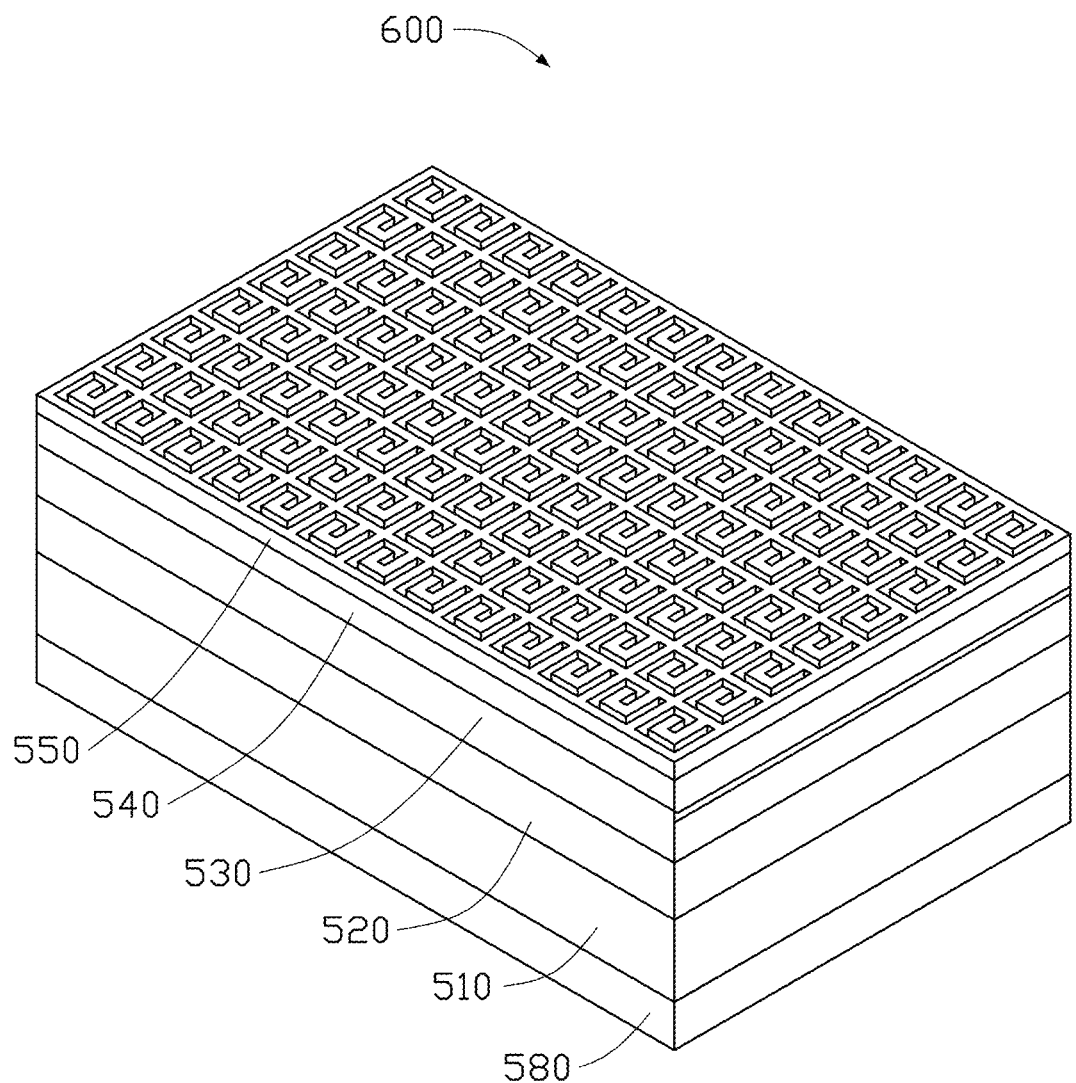
FIG. 18 is a schematic view of another one embodiment of a light emitting device.

Referring to FIG. 18, a light emitting device 600 of one embodiment is a vertical structure LED and includes a reflection layer 580, a first electrode 510, a first semiconductor layer 520, an active layer 530, a second semiconductor layer 540 and a second electrode 550.

The light emitting device 600 is similar with the light emitting device 500 except that a reflection layer 580 is located on a surface of the first electrode 510 that is spaced from the first semiconductor layer 520. The reflection layer 580 covers the first electrode 510. Because part of the light that is emitted from the active layer 530 and travel to the reflection layer 580 will be reflected by the reflection layer 580 to pass through, be polarized and enhanced by the metal metamaterial layer of the second electrode 550, the light emitting efficiency of the light emitting device 600 is enhanced.

Figure 19:
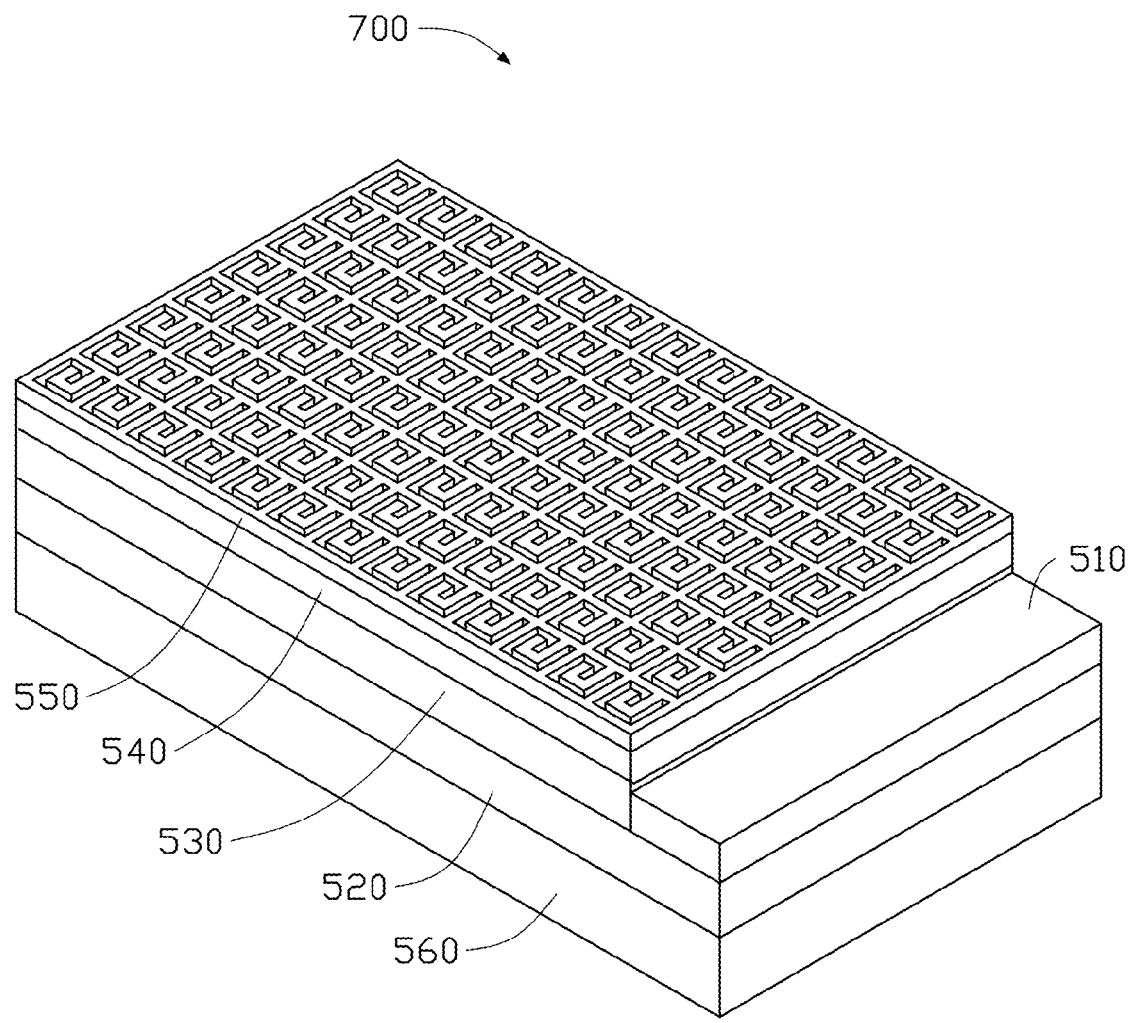
FIG. 19 is a schematic view of another one embodiment of a light emitting device.

Referring to FIG. 19, a light emitting device 700 of one embodiment is a horizontal structure LED and includes a substrate 560, a first electrode 510, a first semiconductor layer 520, an active layer 530, a second semiconductor layer 540 and a second electrode 550.

The light emitting device 700 is similar with the light emitting device 500 except that part of the first semiconductor layer 520 is exposed to form an exposed part, and the first electrode 510 is located on the exposed part of the first semiconductor layer 520. In one embodiment, the substrate 560, the first semiconductor layer 520, the active layer 530, the second semiconductor layer 540 and the second electrode 550 are stacked with each other in that order. The area of the active layer 530, the second semiconductor layer 540 and the second electrode 550 are the same and smaller than that of the first semiconductor layer 520 so that part of the first semiconductor layer 520 is exposed. The second electrode 550 is a metal metamaterial layer spaced from the active layer 530 with a distance less than 100 nanometers.

Figure 20:
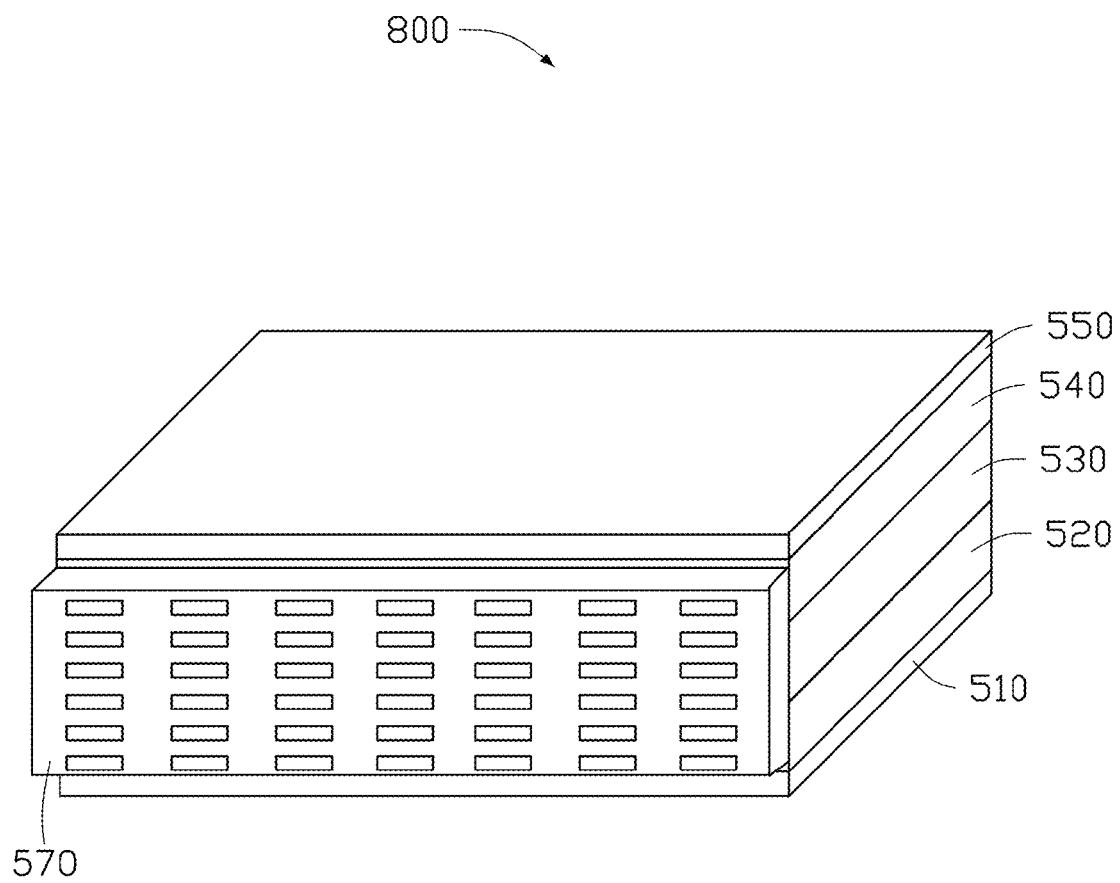
FIG. 20 is a schematic view of another one embodiment of a light emitting device.

Referring to FIG. 20, a light emitting device 800 of one embodiment is a LED and includes a first electrode 510, a first semiconductor layer 520, an active layer 530, a second semiconductor layer 540, a second electrode 550 and a metal metamaterial layer 570.

The light emitting device 800 is similar with the light emitting device 500 except the metal metamaterial layer 570. The metal metamaterial layer 570 is located on a side surface of the light emitting device 800 that is perpendicular with each of the first electrode 510, the first semiconductor layer 520, the active layer 530, the second semiconductor layer 540, and the second electrode 550. In one embodiment, the light emitting device 800 is a cuboid and has four side surfaces. The metal metamaterial layer 570 is located on only one of the four side surfaces. The other three side surfaces can also be coated with metal reflection films. The first electrode 510 and the second electrode 550 can also be a metal metamaterial layer. The metal metamaterial layer 570 has a pattern same as that of the metamaterial layer 120 of FIG. 1. Because the metal metamaterial layer 570 is in direct contact with the active layer 530, the photons produced from the active layer 530 and output from the metal metamaterial layer 570 on the side surface can be enhanced and polarized by the metal metamaterial layer 570. Thus, the light emitting device 800 has an enhanced brightness and can emit polarized light directly.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A light emitting device, comprising a first electrode, a first semiconductor layer, an active layer, a second semiconductor layer and a second electrode; the first electrode is electrically connected to the first semiconductor layer, and the second electrode is electrically connected to the second semiconductor layer; wherein at least one of the first electrode and the second electrode comprises a metal metamaterial layer comprising a plurality of metamaterial units arranged to form a periodic array, and a distance between the metal metamaterial layer and the active layer is less than or equal to 100 nanometers.

2. The light emitting device of claim 1, wherein the first electrode covers the first semiconductor layer, the second electrode covers the second semiconductor layer, and both the first electrode and the second electrode comprises the metal metamaterial layer.

3. The light emitting device of claim 1, wherein only the second electrode comprises the metal metamaterial layer; further comprising a reflection layer located on and covers the first electrode.

4. The light emitting device of claim 1, wherein the first semiconductor layer, the active layer, the second semiconductor layer and the second electrode are stacked on a substrate in that order; areas of the active layer, the second semiconductor layer and the second electrode are the same and smaller than that of the first semiconductor layer so that part of the first semiconductor layer is exposed to form an exposed part, and the first electrode is located on the exposed part; the second electrode comprises the metal metamaterial layer.

5. The light emitting device of claim 1, wherein the plurality of metamaterial units are chirality symmetry and isotropy.

6. The light emitting device of claim 1, wherein the plurality of metamaterial units are chirality symmetry and not isotropy.

7. The light emitting device of claim 1, wherein the plurality of metamaterial units are neither chirality symmetry nor isotropy.

8. The light emitting device of claim 1, wherein a thickness of each of the plurality of metamaterial units is in a range from about 30 nanometers to about 100 nanometers, a period of the plurality of metamaterial units is in a range from about 300 nanometers to about 500 nanometers, and a line width of each of the plurality of metamaterial units is in a range from about 30 nanometers to about 40 nanometers.

9. The light emitting device of claim 1, wherein material of the metal metamaterial layer is selected from the group consisting of gold, silver, copper, iron, aluminum, nickel and alloys thereof.

10. A light emitting device, comprising a first electrode, a first semiconductor layer, an active layer, a second semiconductor layer and a second electrode; the first electrode is electrically connected to the first semiconductor layer, and the second electrode is electrically connected to the second semiconductor layer; the first semiconductor layer, the active layer, and the second semiconductor layer are stacked with each other in that order to form a semiconductor structure, the semiconductor structure defines a side surface perpendicular with each of the first semiconductor layer, the active layer, and the second semiconductor layer; wherein further comprising a metal metamaterial layer located on the side surface, and the metal metamaterial layer comprises a plurality of metamaterial units arranged to form a periodic array.

11. The light emitting device of claim 10, wherein the plurality of metamaterial units are chirality symmetry and isotropy.

12. The light emitting device of claim 10, wherein the plurality of metamaterial units are chirality symmetry and not isotropy.

13. The light emitting device of claim 10, wherein the plurality of metamaterial units are neither chirality symmetry nor isotropy.

14. The light emitting device of claim 10, wherein a thickness of each of the plurality of metamaterial units is in a range from about 30 nanometers to about 100 nanometers, a period of the plurality of metamaterial units is in a range from about 300 nanometers to about 500 nanometers, and a line width of each of the plurality of metamaterial units is in a range from about 30 nanometers to about 40 nanometers.

15. A display device, comprising a light emitting device, a light guide plate and a liquid crystal panel, wherein the light emitting device comprises a first electrode, a first semiconductor layer, an active layer, a second semiconductor layer and a second electrode; the first electrode is electrically connected to the first semiconductor layer, and the second electrode is electrically connected to the second semiconductor layer; at least one of the first electrode and the second electrode comprises a metal metamaterial layer comprising a plurality of metamaterial units arranged to form a periodic array, and a distance between the metal metamaterial layer and the active layer is less than or equal to 100 nanometers.

16. The display device of claim 15, wherein the plurality of metamaterial units are chirality symmetry and isotropy.

17. The display device of claim 15, wherein the plurality of metamaterial units are chirality symmetry and not isotropy.

18. The display device of claim 15, wherein the plurality of metamaterial units are neither chirality symmetry nor isotropy.

19. The display device of claim 15, wherein a thickness of each of the plurality of metamaterial units is in a range from about 30 nanometers to about 100 nanometers, a period of the plurality of metamaterial units is in a range from about 300 nanometers to about 500 nanometers, and a line width of each of the plurality of metamaterial units is in a range from about 30 nanometers to about 40 nanometers.

* * * * *